United States Patent
Noest et al.

(10) Patent No.: US 7,457,593 B2
(45) Date of Patent: Nov. 25, 2008

(54) ATTENUATOR SYSTEM

(75) Inventors: Peter Noest, Munich (DE); Wilhelm Kraemer, Bad Reichenhall (DE)

(73) Assignee: Rhode & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/562,352

(22) PCT Filed: Jun. 18, 2004

(86) PCT No.: PCT/EP2004/006618

§ 371 (c)(1),
(2), (4) Date: May 15, 2006

(87) PCT Pub. No.: WO2005/002072

PCT Pub. Date: Jan. 6, 2005

(65) Prior Publication Data

US 2006/0244548 A1   Nov. 2, 2006

(30) Foreign Application Priority Data

Jun. 27, 2003 (DE) ................................ 103 29 089
Jul. 18, 2003 (DE) ................................ 103 32 808

(51) Int. Cl.
*H03C 1/62* (2006.01)
*H04B 1/04* (2006.01)

(52) U.S. Cl. .............. 455/115.1; 455/127.2; 455/226.1; 455/232.1

(58) Field of Classification Search .............. 455/115.1, 455/126, 226.1, 127.1, 127.2, 232.1
See application file for complete search history.

(56) References Cited

U.S. PATENT DOCUMENTS 3,369,096 A * 2/1968 Gattaz ........................ 200/504
4,315,254 A * 2/1982 Honjyo et al. .............. 341/120
5,347,239 A * 9/1994 Loehner et al. ........... 333/81 R (Continued)

FOREIGN PATENT DOCUMENTS

DE           69523453         5/2002

(Continued)

OTHER PUBLICATIONS

K. Lange and K.-H Loecherer, Taschenbuch der Hochfrequenztechnik Grundlagen, Komponenlen, Systeme, Meinke·Gundlach, Nov. 17, 1992, pp. 21-22, Springer-Verlag, Berlin/Heidelberg, Germany.

(Continued)

*Primary Examiner*—Quochien B Vuong
(74) *Attorney, Agent, or Firm*—Ditthavong Mori & Steiner, P.C.

(57) ABSTRACT

An attenuator system for adjusting the output of an HF signal source is described in which, between the signal source and an output, an electronic attenuator is disposed via mechanical switches on the input and output side. The mechanical switches can be switched in such a manner that, in one switch position, the electronic attenuator is inserted between the signal source and the output, and in the other switch position, a direct bypass is inserted between the signal source and the output.

4 Claims, 1 Drawing Sheet

U.S. PATENT DOCUMENTS

| | | | | |
|---|---|---|---|---|
| 5,793,863 | A | * | 8/1998 | Hashimoto .................. 455/570 |
| 5,862,461 | A | * | 1/1999 | Yoshizawa et al. ....... 455/127.3 |
| 6,339,353 | B1 | * | 1/2002 | Tomita et al. ............... 327/210 |
| 5,793,863 | A | * | 8/1998 | Hashimoto .................. 455/570 |
| 5,862,461 | A | * | 1/1999 | Yoshizawa et al. ....... 455/127.3 |
| 6,339,353 | B1 | * | 1/2002 | Tomita et al. ............... 327/210 |
| 6,472,948 | B1 | | 10/2002 | Kyriakos et al. |

FOREIGN PATENT DOCUMENTS

| | | |
|---|---|---|
| DE | 10063999 | 8/2002 |
| DE | 60000467 | 5/2003 |
| EP | 0 208 441 | 1/1987 |
| EP | 0 762 638 | 3/1997 |
| EP | 0 998 032 | 5/2000 |
| GB | EP0208441 A2 * | 1/1987 |
| JP | 62222708 | 9/1987 |
| JP | 07022999 | 1/1995 |

OTHER PUBLICATIONS

Database WPI, Section EI, Week 200307, Jul. 13, 2002, Derwent Publications Ltd., London, Great Britain & KR2002 059 463 (LG Innotec Co. Ltd), Jul. 13, 2005.

International Preliminary Report on Patentability (PCT/EP2004/006618), May 11, 2006.

* cited by examiner

ATTENUATOR SYSTEM

FIELD OF THE INVENTION

The invention relates to an attenuator system for adjusting the output power of a high-frequency signal source.

BACKGROUND OF THE INVENTION

Attenuators for adjusting the output power of high-frequency signal sources such as signal generators are known in extremely diverse embodiments. The throughput attenuation of an attenuator of this kind can be adjusted within a broad dynamic range through a stepwise connection and disconnection of attenuation elements. The individual attenuation elements are connected to T networks or Pi networks by changeover switches, which are realized as electronic switches in modern equipment. Attenuators of this kind, which can be switched by means of electronic switches such as PIN diodes or transistors, for example, gallium arsenide MESFET transistors, are referred to as electronic attenuators.

Published German patent application DE 100 63 999, for example, discloses such an electronic attenuator.

The advantage of such electronic attenuators is in the faster switching speed and a substantially lower dependence of the operating life upon the number of switching cycles by comparison with attenuators with mechanical switching relays. One disadvantage of electronic attenuators, however, is their relatively high insertion loss (minimum attenuation, fundamental attenuation), for example, up to 5 dB, and their reduced linearity. Furthermore, the maximum output power is lower than with mechanical attenuators with mechanical changeover switches.

SUMMARY OF THE INVENTION

There exists a need to provide an attenuator, which combines the advantageous properties of an electronic attenuator with a low insertion loss.

In accordance with one aspect of the present invention, an attenuator system for adjusting the output power of a high-frequency signal source is disclosed herein.

By means of the bypass line (bypass), which, according to an aspect of the invention, is connected mechanically parallel to a conventional electronic attenuator, which comprises two simple, coaxial changeover switches or transfer switches with a coaxial line component connecting the latter, the electronic attenuator can be used in the conventional manner for a low output power of the signal source; for a higher output power, the mechanical bypass is connected and the electronic attenuator is disconnected, so that the full output power of the HF signal source is connected through to the output via the practically attenuation-free bypass.

In this bypass switching position, the output line can be adjusted through the output amplifier of the signal source, or the bypass itself can be formed as a mechanical attenuator; i.e., with additional mechanical coaxial changeover switches in the bypass, it is possible to switch between two or more different attenuation elements, so that the output power can also be adjusted for higher powers.

According to an aspect of the invention, the two, for example, bi-stable coaxial changeover switches at the input and output of the electronic attenuator, which are provided for the connection of the bypass, can, at the same time, also be exploited for the purpose of over-voltage protection. Accordingly, it is possible to assign to the output of the signal source a corresponding over-voltage detector which, for example, in the event of a connection of a high external voltage to the output of the signal source, disconnects the electronic attenuator from the output via the output-end mechanical changeover switch, so that the electronic attenuator is then connected via the other mechanical changeover switch only to the signal source. Accordingly, irreversible changes and/or damage to the electronic attenuator, the signal source and other circuit components resulting from over-voltage at the device output are prevented.

The lines and mechanical switches used in the system according to an embodiment of the invention may be high-frequency compatible and are therefore designed, for example, as coaxial lines, coaxial changeover switches, multiple changeover switches or transfer switches with a defined surge impedance.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The invention is described in greater detail below with reference to a schematic drawing of an exemplary embodiment. The drawing is as follows.

DETAILED DESCRIPTION OF THE PREFERRED EMBODIMENT

Figure 1:
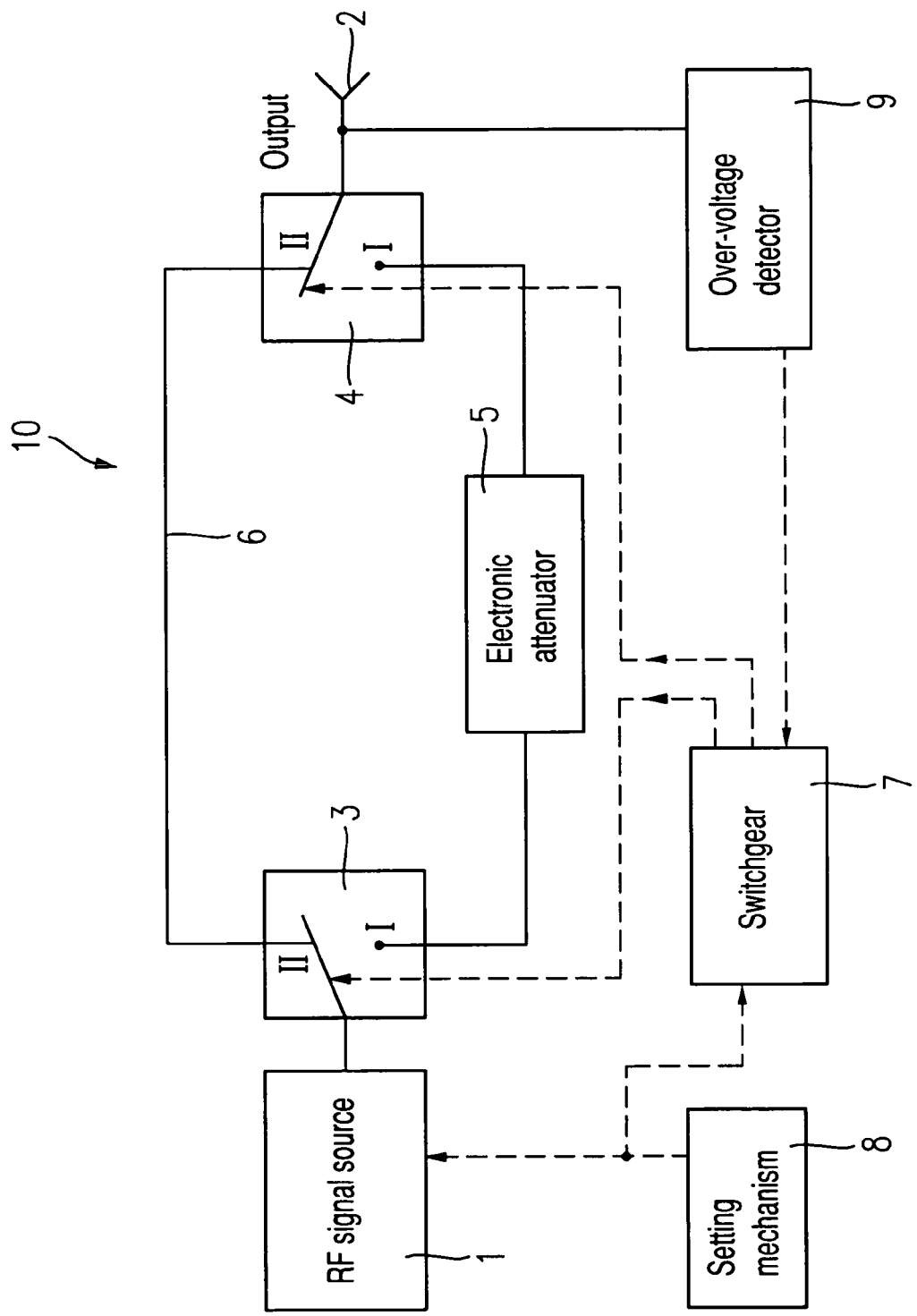
FIG. 1 shows an exemplary embodiment of an attenuator system consistent with the invention.

FIG. 1 shows an attenuator system 10 according to an embodiment of the invention for adjusting the output power of a high-frequency signal source 1, for example, a signal generator, at the output 2. For this purpose, a conventional electronic attenuator 5, of which the attenuation elements are connected and disconnected via semiconductor elements, such as metallic semiconductor field effect transistors (MESFET), is connected between the signal source 1 and the output 2, via an input-end mechanical changeover switch and an output-end mechanical changeover switch 3, 4.

The attenuation of this electronic attenuator 5 is variable, for example, within the range between nominal 0 dB (on the basis of the fundamental attenuation or insertion loss up to 5 dB real) and 125 dB in 5 dB steps within the frequency range between 100 kHZ and 3 GHz. A coaxial bypass line 6 is arranged parallel to this electronic attenuator 5 between the two mechanical changeover switches 3 and 4. The two changeover switches 3 and 4 are designed, for example, as mechanical relay switches (SPOT=Single Pole Double Through Relays) and can be switched jointly by means of a switchgear 7.

This switchgear 7 is connected to the setting mechanism 8 for the output power of the signal source 1 in such a manner that, for a low output power below a predetermined power threshold, the two relay changeover switches 3 and 4 occupy the switching position I, and accordingly connect the electronic attenuator 5 between the signal source 1 and the output 2. If a higher output power is set by the setting mechanism 8 of the signal source 1, the two mechanical changeover switches 3, 4 are switched by the switchgear 7 into the switching position II, and the signal source 1 is therefore connected via the coaxial bypass line 6 directly to the output 2. Accordingly, the maximum output power is then available at the output 2 and is no longer attenuated by the fundamental attenuation (insertion loss) of the electronic attenuator.

If a further fine adjustment of the output power is desired in this higher power range, it may be advantageous to form the coaxial bypass line 6 itself as a mechanical attenuator and to connect, for example, two or more attenuation elements into the bypass line 6 through additional mechanical changeover switches.

The switchgear 7 of the mechanical changeover switches 3, 4 can advantageously be connected to an over-voltage detector 9 assigned to the output 2 of the attenuator system 1 in such a manner that, if a permitted level is exceeded at the output 2, the output-end mechanical changeover switch 4, disconnects the electronic attenuator 5 from the output 2, and the input-end mechanical changeover switch 3 connects the electronic attenuator 5 to the signal source 1.

The attenuator system 10 according to an embodiment of the invention is not only advantageous for HF signal generators, but, with the provision of the bypass line 6, could also be used with other measuring devices such as network analyzers or spectrum analyzers or even with high-frequency receivers in the input stage, that is to say, anywhere, where the relatively high fundamental attenuation and/or poorer linearity of an electronic attenuator 5 is problematic.

While the present invention has been described in connection with a number of embodiments and implementations, the present invention is not so limited but covers various obvious modifications and equivalent arrangements, which fall within the purview of the appended claims.

What is claimed is:

1. An attenuator system for adjusting the output power of an HF signal source, the attenuator system comprising:
    an electronic attenuator;
    a mechanical changeover switch at an input-end of the electronic attenuator;
    a mechanical changeover switch at an output-end of the electronic attenuator; and
    a switchgear of the mechanical changeover switches coupled to an over-voltage detector assigned to the output of the signal source,
    wherein the electronic attenuator is arranged between the signal source and an output, and the mechanical changeover switches are configured for switching to a first switching position wherein the electronic attenuator is connected between the signal source and the output, a second switching position wherein a direct bypass line is connected between the signal source and the output, and if a predetermined permitted level is exceeded at the output, the mechanical changeover switch at the output-end disconnects the electronic attenuator from the output, and the mechanical changeover switch at the input-end connects the electronic attenuator to the signal source.

2. An attenuator system according to claim 1, wherein the direct bypass line is formed as a mechanical attenuator, which is switched via mechanical switches between a plurality of attenuation values.

3. An attenuator system according to claim 1, wherein the mechanical changeover switches are bi-stable coaxial relay changeover switches.

4. An attenuator system according to claim 1, wherein the mechanical changeover switches are transfer switches.

* * * * *